US008686557B2

(12) United States Patent
Hockel

(10) Patent No.: US 8,686,557 B2
(45) Date of Patent: Apr. 1, 2014

(54) ILLUMINATION DEVICE COMPRISING A LIGHT-EMITTING DIODE

(75) Inventor: Jens Florian Hockel, München (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 185 days.

(21) Appl. No.: 13/120,073

(22) PCT Filed: Sep. 10, 2009

(86) PCT No.: PCT/EP2009/061721

§ 371 (c)(1),
(2), (4) Date: Mar. 21, 2011

(87) PCT Pub. No.: WO2010/031723

PCT Pub. Date: Mar. 25, 2010

(65) Prior Publication Data

US 2011/0170297 A1 Jul. 14, 2011

(30) Foreign Application Priority Data

Sep. 19, 2008 (DE) ......................... 10 2008 047 933

(51) Int. Cl.
*H01L 23/02* (2006.01)

(52) U.S. Cl.
USPC ......... 257/712; 257/713; 257/98; 362/249.02

(58) Field of Classification Search
USPC ................ 362/646, 640, 249.02, 249.11, 231
See application file for complete search history.

(56) References Cited

U.S. PATENT DOCUMENTS

| | | | | |
|---|---|---|---|---|
| 5,455,457 | A | 10/1995 | Kurokawa | |
| 7,758,223 | B2 * | 7/2010 | Osawa et al. | 362/547 |
| 2003/0021113 | A1 | 1/2003 | Begemann | |

FOREIGN PATENT DOCUMENTS

| | | |
|---|---|---|
| CN | 1531119 | 9/2004 |
| CN | 2864341 | 1/2007 |
| CN | 101089221 | 12/2007 |
| CN | 100378974 | 4/2008 |
| CN | 101241267 | 8/2008 |

* cited by examiner

*Primary Examiner* — Anabel Ton
(74) *Attorney, Agent, or Firm* — Cozen O'Connor

(57) ABSTRACT

An illumination device (1) having comprising at least one support element (4) and at least one light-emitting diode (5) arranged on the support element (4), characterized in that wherein at least one of the plurality of components (2, 3, 4, 7, 10) of the illumination device (1) intended for heat dissipation from the light-emitting diode (5), in particular the support element (4), is provided at least in part with an electrically insulating layer (6, 11) having a high thermal conductivity, formed at least in part from a carbon compound, in particular from amorphous carbon, in particular tetrahedral amorphous carbon.

21 Claims, 1 Drawing Sheet

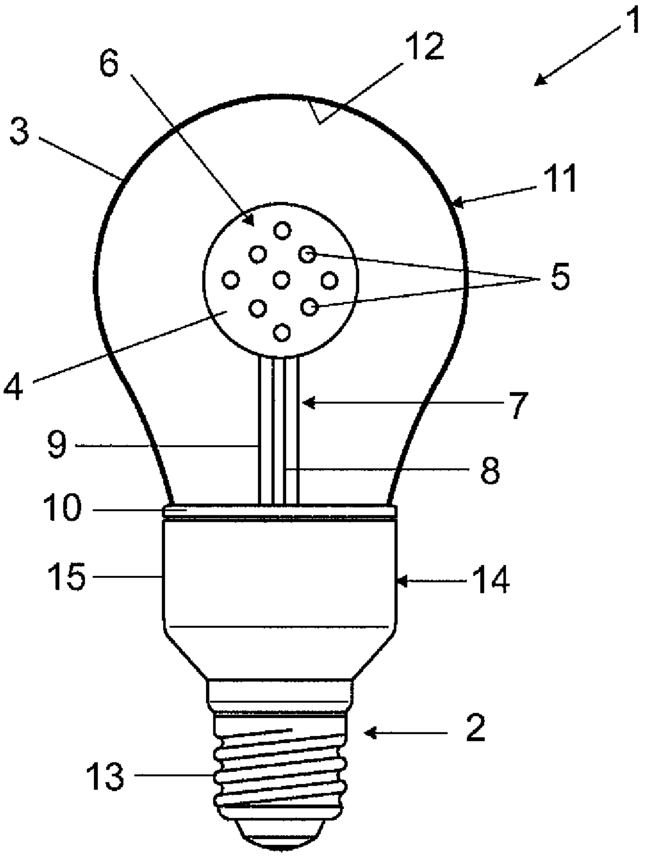
1
12
6
3
11
5
4
7
9
8
10
15
14
2
13

ILLUMINATION DEVICE COMPRISING A LIGHT-EMITTING DIODE

RELATED APPLICATIONS

This is a U.S. national stage of application No. PCT/EP2009/061721, filed on Sep. 10, 2009.

This application claims the priority of German application no. 10 2008 047 933.0 filed Sep. 19, 2008, the entire content of which is hereby incorporated by reference.

FIELD OF THE INVENTION

The invention relates to an illumination device having at least one support element and at least one light-emitting diode arranged on the support element.

BACKGROUND OF THE INVENTION

Illumination devices having light-emitting diodes are increasingly being used in general lighting on account of their high efficiency and falling manufacturing costs. On account of their small size, the actual light-emitting diodes are in this situation mostly arranged on a support element, on which in addition can be arranged further elements such as for example other light-emitting diodes, feed lines or circuits.

In this situation, the LED lamps which are preferably employed in order to replace existing conventional lamps such as for example incandescent lamps or fluorescent lamps without needing to make changes here to the luminaire or the holder represent a special form of the illumination devices. With regard to LED lamps, the support element with one or more light-emitting diodes is fitted on a conventional base, whereby in order to convert the line voltage to the supply voltage for the LED an electrical circuit is for the most part also provided.

Such so-called retrofit solutions are preferably intended to be evocative in their appearance of the known incandescent lamps and therefore for the most part also have a bulb which encloses the support element and the light-emitting diodes and is similar in its form to the known structural shapes of conventional incandescent lamps.

A disadvantage of illumination devices in accordance with the prior art and here in particular of LED lamps is however the fact that the heat produced during operation of the LED can only be inadequately dissipated. Although a support element having a high thermal conductivity is frequently chosen, made of copper or aluminum for example, in order to dissipate the heat directly from the LEDs, an insulating layer must however in this case be arranged between LED and support element, said insulating layer diminishing the thermal conduction and increasing the manufacturing costs.

SUMMARY OF THE INVENTION

One object of the present invention is to create an illumination device having at least one support element and at least one light-emitting diode arranged on the support element, wherein the described disadvantages, in particular with regard to the cooling of the LED, are avoided.

This and other objects are attained in accordance with one aspect of the present invention by an illumination device comprising at least one support element and at least one light-emitting diode arranged on the support element, wherein at least one of the plurality of components of the illumination device intended for heat dissipation from the light-emitting diode is provided at least in part with an electrically insulating layer having a high thermal conductivity, formed at least in part from a carbon compound.

By providing at least one of the components of the illumination device intended for heat dissipation from the light-emitting diode, in particular the support element, at least in part with an electrically insulating layer having a high thermal conductivity, this makes possible the dissipation of the heat given off by the LEDs in a simple manner and simultaneously achieves good electrical insulation of the coated component. In this situation, within the scope of this patent application those layers are to be regarded as a layer having a high thermal conductivity which in particular have a higher thermal conductivity than the underlying substrate, in any case however layers having a thermal conductivity which under standard conditions is higher than 20 W/mK, in particular higher than 200 W/mK, particularly preferably higher than 600 W/mK. Electrically insulating materials are characterized by a high specific resistance typically in excess of $10^3$ Ωm, in particular in excess of $10^5$ Ωm, particularly preferably in excess of $10^8$ Ωm.

The layer is formed at least in part from carbon, in particular from amorphous carbon, preferably tetrahedral amorphous carbon. Carbon can occur in different modifications having different mechanical and electrical properties and can be well adapted to suit requirements. In addition to having a high resistance to wear, amorphous carbon is characterized most notably by a high specific resistance (>$10^3$ Ωm) and a high thermal conductivity (approx. 1000 W/mK), which means that said amorphous carbon is particularly well suited for a coating according to the invention. Amorphous carbon is also an essential constituent of diamond-like composite materials, which may for example contain silicon as a further component in order to match the properties to suit the requirements.

Coatings are also simple to apply to complicated geometries and the properties can be advantageously set, for example through choice of the layer thickness and the material, whereby in addition to the thermal conductivity in particular the electrical conductivity and also the permeability for electromagnetic radiation of different wavelengths can be advantageously influenced.

According to an embodiment of the invention, a support element can for example be provided with a layer according to the invention, on which the light-emitting diodes can be arranged such that a particularly good dissipation of the heat from the light-emitting diodes is achieved in that said heat is dissipated directly both to the side and also downwards. Particularly in the case of a support element having a relatively low thermal conductivity, for example a plastic circuit board, the lateral dissipation of the heat is advantageous because said heat can thus be distributed over a large area. Because the layer is in addition electrically insulating, the terminals of the LED are automatically insulated with respect to one another regardless of the material of the support element. A particularly advantageous embodiment thus also becomes possible in that a metallic support element, which thus has a good thermal conductivity, for example a copper or aluminum support, can be used, by means of which the heat dissipation from the LED can be effected particularly advantageously.

If parts which can be touched by the user are coated, a housing or heat sink for example, said parts may be in contact with live parts, the holder for example, without any danger existing for the user on touching said parts.

Such layers can be easily applied by using different coating methods, the PECVD method for example, to different substrates, in particular to metals and glass.

In a further expedient embodiment of the invention the layer is at least in part formed from a ceramic material, in particular aluminum nitride. Ceramic materials are also dielectrics which meet the requirements in respect of the specific electrical resistance and, in particular when aluminum nitride is used, the thermal conductivity.

It is expedient if the layer has a preferably constant thickness of at least 1 μm and at most 3 μm, preferably of approximately 2 μm. This layer thickness can be simply applied but is also sufficiently great to ensure that no accidentally uncoated regions are produced. In this situation, a layer is regarded as constant when the maximum deviation from the average layer thickness does not exceed 5%. If translucent components such as for example an optical system for light guidance or the bulb of an LED lamp are to be coated, the visible light permeability is not too greatly reduced at said layer thicknesses.

The invention has a particularly advantageous effect when the illumination device has at least a base and/or at least a bulb enclosing the light-emitting diode and the support element and is thus designed as an LED lamp. With regard to these lamps, the support element and the light-emitting diodes are enclosed by base and bulb, as a result of which the dissipation of the heat is rendered more difficult. The additional or alternative use of a heat sink visible from the outside and the provision of the bulb with ventilation slots in order to dissipate the heat is disadvantageous because these measures adversely affect the appearance of the lamp in an undesirable manner and promote the deposition of dust and dirt. Through the use of the coating according to the invention, a simpler and more effective distribution of the heat in the LED lamp can be accomplished, which facilitates the dissipation of said heat.

This holds true in particular in the situation when the bulb is provided at least in part with the layer having a high thermal conductivity. Heat introduced into the bulb can thus be distributed over the entire surface of the bulb, where it can be dissipated particularly well to the surrounding area. Expediently in this situation the bulb is operatively connected thermally with the LED and/or support element since the heat of the LED can thus be dissipated by way of the bulb.

In this situation it is particularly advantageous if the layer is arranged on the outside of the bulb because this is exposed to the ambient air and can dissipate the heat to the latter.

Advantageously, the bulb is coated at least in part with a conversion layer for the at least partial conversion of at least one wavelength of the radiation delivered by the LED into a different wavelength. The light color of the LED lamp can be set by this means. In contrast to a conversion layer which is arranged directly in the region of the LED, a conversion layer arranged on the bulb is subjected to lesser loads, in particular loads of a thermal nature.

Advantageously, the conversion layer is arranged on the inside of the bulb because it is protected there against ambient influences.

By providing on the bulb at least one layer which is largely impermeable to UV radiation, in particular which absorbs and/or reflects UV radiation, in particular the layer having a high thermal conductivity which is designed as a layer largely impermeable to UV radiation, UV light originating from the LED which is harmful to the user is reliably screened. In the case of a reflective layer, the UV radiation can continue to be directed back onto the conversion layer situated further inwards, thereby increasing the efficiency of the LED lamp.

A bulb made of glass is particularly well suited for providing with a heat conducting layer because said bulb is largely insensitive to the heat produced during the creation of the layer and also during the operation of the LED lamp.

Expediently, the wavelength of the radiation emitted by at least one light-emitting diode lies in a range between 410 nm and 540 nm, preferably between 440 nm and 510 nm, in particular at approximately 470 nm. Such wavelength ranges are advantageous particularly in conjunction with a conversion layer because white light can be generated particularly simply by this means.

Expediently, the support element is operatively connected thermally with the base of the LED lamp. By this means the heat can be dissipated from the support element to the base and further distributed from there, for example to a suitable holder or to the bulb.

By operatively connecting the support element with the base of the illumination device by way of at least one connection element, preferably designed as a heat pipe, a particularly good heat transfer is achieved and the support element can simultaneously be freely positioned inside the bulb. This means that the support element can be particularly simply implemented as a three-dimensional body which can also be equipped on all sides with light-emitting diodes and an all-round light emission can thus be realized with simple means.

Advantageously, the support element and/or at least one connection element between the support element and the base of the illumination device is provided with the layer having a high thermal conductivity. This means that the heat is particularly well distributed on the support element or dissipated from the latter.

Expediently, electronic components for controlling the at least one light-emitting diode are arranged in the region of the holder of the illumination device. In this position the components are arranged as far away from the LED as possible and as a result are subjected to a lower thermal load. In addition, in particular when using a metallic holder the components can be easily screened, which means that a good EMC compatibility is ensured.

BRIEF DESCRIPTION OF THE SINGLE DRAWING

The drawing depicts an embodiment of an illumination device according to an embodiment of the invention.

DETAILED DESCRIPTION OF THE SINGLE DRAWING

The invention will be described in detail in the following with reference to an exemplary embodiment. As an example of an illumination device 1 according to the invention the figure shows an LED lamp 1 having a base 2, a bulb 3 and a support element 4, on which are arranged light-emitting diodes (LED) 5.

The support element 4 is formed from aluminum and coated with a nonconducting layer 6 consisting of tetrahedral amorphous carbon (so-called diamond-like carbon, DLC) having a thickness of approximately 2 μm. This layer is both electrically insulating and also outstandingly thermally conductive (more than 600 W/mK, typically approx. 1000 W/mK). This means that the LEDs 5 have an outstanding thermal connection to the support element 4 and are also insulated electrically from the latter. The high thermal conductivity of the DLC layer 6 simultaneously has the effect that the heat being given off by the LEDs 5 is distributed along the surface of the support element 4 and good heat dissipation is thus enabled both to the surrounding area and also into the interior of the support element 4.

The support element 4 is connected with the base 2 by way of a so-called heat pipe 7 such that the heat from the LEDs 5 can be dissipated by way of the support element 4 and the heat pipe 7 to the base 2. For at least one polarity the heat pipe 7 simultaneously also serves to supply power to the support element 4, whereby through suitable configuration one polarity is transferred by way of the inner pipe 8 and the second polarity is transferred by way of the outer pipe 9.

Embodiments are however also conceivable wherein the power supply to the support element 4 is effected for one polarity by means of the heat pipe 7, which is likewise coated on its outside with tetrahedral amorphous carbon, and the second polarity is routed by way of a conductor path on the DLC layer to the support element 4.

The heat pipe 7 in turn is operatively connected thermally with the bulb 3, in the exemplary embodiment by way of a cylindrical aluminum plate 10 on which the bulb 3 is mounted. The bulb 3 is produced from glass and coated on the outside likewise with a layer 11 consisting of tetrahedral amorphous carbon. The heat is transferred from the aluminum plate 10 onto the layer 11 and thus is distributed on the surface of the bulb 3 and dissipated to the surrounding area on account of the outstanding thermal conductivity of the layer 11. At approx. 2 μm the thickness of the layer 11 is chosen such that good heat dissipation is ensured and that nevertheless the light permeability of the bulb 3 for the relevant wavelengths is not significantly impaired.

The LEDs 5 emit light at a wavelength of approximately 470 nm. The bulb 3 is coated on the inside with a conversion layer 12 which converts the radiation originating from the LEDs 5 in part into a different wavelength range and thus serves to generate white light. The choice of a suitable conversion material is within the normal capacities of a person skilled in the art. Possible choices for this purpose with regard to the use of blue LEDs 5 are for example also described in EP1206802.

In the present exemplary embodiment, the base 2 comprises a standard E27 Edison thread part 13 and a cylindrical part 14 which contains the electronic components (not shown here) for supplying voltage to and controlling the LEDs 5. The size of the cylindrical part 14 depends on the space requirement for the electronic components. In the present exemplary embodiment, the outer wall 15 of the cylindrical part 14 is produced from a polymer material, in particular in order to satisfy safety requirements and to enable simple manufacture of the holder 2. Embodiments are however also conceivable wherein a metal is used for this purpose in order for example to dissipate heat to the thread part 13 and thus to the holder.

Other embodiments of the invention are naturally also conceivable. Instead of an LED lamp 1, it is thus in particular also possible to provide a different illumination device 1 based on light-emitting diodes 5, for example a single LED module which in practical terms comprises only LED 1 and support element 4 and if applicable a heat sink and/or electrical components. It is however also possible to implement a complete LED luminaire according to the invention by for example coating parts of the housing, a diffuser or other optical element. With regard to the coating of housing components, the high resistance to wear both of DLC layers and also of ceramic layers as well as their insensitivity to corrosion are also of advantage because the illumination device can also be employed under unfavorable ambient conditions.

With regard to an LED lamp 1 according to the invention, it is furthermore possible for example to produce the bulb 3 from plastic, which enables simple and cost-effective manufacturing. The shape of the bulb 3 can also differ from the shape shown here and modeled on a general service lighting incandescent lamp and can for example resemble a reflector lamp. Instead of a coating for bulb 3 and support element 4, embodiments are naturally also possible wherein only one of the components is coated.

The person skilled in the art knows a multiplicity of embodiments for type and arrangement of the LEDs 5 on the support element 4 and also the shape of the support element 4, whereby in particular instead of the blue LEDs 5 shown it is also possible to use LEDs having other predominant wavelengths. In particular, the use of UV LEDs should be mentioned here, whereby when the LED lamp 1 is used for illumination purposes the use of a conversion layer 12 and also of a bulb material or a coating which prevents the emission of UV radiation at a harmful level is imperative. When LEDs 5 of different colors are used, the bulb 3 can also be used as a diffusion element in order to mix the colors of the individual LEDs 5 and thus to generate a white light color.

Instead of the DLC coating 6, 11, other coating materials are also conceivable, in particular aluminum nitride and also carbon-based diamond-like nanocoatings which contain further constituents in significant amounts in addition to carbon.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An illumination device comprising:

at least one support element:

at least one light-emitting diode arranged on the support element;

a plurality of components configured for heat dissipation from the light-emitting diode; and an electrically insulating layer having a high thermal conductivity, formed at least in part from a carbon compound, and arranged on at least a portion of at least one of the plurality of components configured for heat dissipation from the light-emitting diode.

2. The illumination device as claimed in claim 1, wherein the insulating layer has a preferably constant thickness of at least 1 μm and at most 3 μm.

3. The illumination device as claimed in claim 1, wherein the illumination device has at least one of a base and at least a bulb enclosing the light-emitting diode and the support element.

4. The illumination device as claimed in claim 3, wherein the bulb is provided at least in part with the layer having the high thermal conductivity.

5. The illumination device as claimed in claim 3, wherein the layer is arranged on the outside of the bulb.

6. The illumination device as claimed in claim 3, wherein the bulb is coated at least in part with a conversion layer for at least partial conversion of at least one wavelength of the radiation delivered by the light-emitting diode into a different wavelength.

7. The illumination device as claimed in claim 6, wherein the conversion layer is arranged on the inside of the bulb.

8. The illumination device as claimed in claim 3, wherein at least one layer which is largely impermeable to UV radiation, is provided on the bulb.

9. The illumination device as claimed in claim 3, wherein the bulb is glass.

10. The illumination device as claimed in claim 1, wherein the wavelength of the radiation emitted by at least one light-emitting diode lies in a range between 410 nm and 540 nm.

11. The illumination device as claimed in claim 3, wherein the support element is operatively connected thermally with the base of the illumination device.

12. The illumination device as claimed in claim 3, wherein the support element is operatively connected with the base of the illumination device by way of at least one connection element.

13. The illumination device as claimed in claim 3, wherein at least one of the support element and at least one connection element between the support element and the base of the illumination device is provided with the layer having the high thermal conductivity.

14. The illumination device as claimed in claim 1, wherein said at least one of the plurality of components of the illumination device configured for heat dissipation from the light-emitting diode is said support element.

15. The illumination device as claimed in claim 1, wherein said carbon compound is amorphous carbon.

16. The illumination device as claimed in claim 15, wherein said amorphous carbon is tetrahedral amorphous carbon.

17. The illumination device as claimed in claim 1, wherein the insulating layer has a constant thickness of approximately 2 μm.

18. The illumination device as claimed in claim 8, wherein said at least one layer which is largely impermeable to UV radiation has a high thermal conductivity.

19. The illumination device as claimed in claim 10, wherein the wavelength of the radiation emitted by the at least one light-emitting diode lies in a range between 440 nm and 510 nm.

20. The illumination device as claimed in claim 19, wherein the wavelength of the radiation emitted by the at least one light-emitting diode lies at approximately 470 nm.

21. The illumination device as claimed in claim 12, wherein the at least one connection element is a heat pipe.

* * * * *